(12) United States Patent
Kumbhat et al.

(10) Patent No.: US 8,633,601 B2
(45) Date of Patent: Jan. 21, 2014

(54) INTERCONNECT ASSEMBLIES AND METHODS OF MAKING AND USING SAME

(75) Inventors: Nitesh Kumbhat, Atlanta, GA (US); Abhishek Choudhury, Atlanta, GA (US); Venkatesh V. Sundaram, Alpharetta, GA (US); Rao R. Tummala, Greensboro, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 13/383,727

(22) PCT Filed: Jul. 13, 2010

(86) PCT No.: PCT/US2010/041828
§ 371 (c)(1),
(2), (4) Date: Jan. 12, 2012

(87) PCT Pub. No.: WO2011/008759
PCT Pub. Date: Jan. 20, 2011

(65) Prior Publication Data
US 2012/0104603 A1    May 3, 2012

Related U.S. Application Data

(60) Provisional application No. 61/225,015, filed on Jul. 13, 2009, provisional application No. 61/307,113, filed on Feb. 23, 2010.

(51) Int. Cl.
*H01L 23/52*    (2006.01)
(52) U.S. Cl.
USPC ........... 257/785; 257/737; 257/738; 257/777; 257/780; 257/E21.506; 257/E21.575; 257/E23.021; 438/612; 438/613; 438/6; 438/108; 438/618; 439/65

(58) Field of Classification Search
USPC ................ 257/737, 738, 777, 780, 782, 785, 257/E21.506, E21.575, E23.021; 438/612, 438/613, 6, 108, 618; 439/65
See application file for complete search history.

(56) References Cited

U.S. PATENT DOCUMENTS 6,002,168 A * 12/1999 Bellaar et al. ................ 257/696
6,208,025 B1 * 3/2001 Bellaar et al. ................ 257/696

(Continued)

OTHER PUBLICATIONS

Osborn, T.; Ate He; Lightsey, H.; Kohl, P., "All-copper chip-to-substrate interconnects: Bonding, testing, and design for electrical performance and thermo-mechanical reliability," Electronic Components and Technology Conference, 2008. ECTC 2008. 58th , vol., No., pp. 67,74, May 27-30, 2008 doi: 10.1109/ECTC.2008. 4549952.*

(Continued)

*Primary Examiner* — Bac Au
*Assistant Examiner* — Victor Barzykin
(74) *Attorney, Agent, or Firm* — Ryan A. Schneider, Esq.; Troutman Sanders LLP

(57) ABSTRACT

The various embodiments of the present invention provide fine pitch, chip-to-substrate interconnect assemblies, as well as methods of making and using the assemblies. The assemblies generally include a semiconductor having a die pad and a bump disposed thereon and a substrate having a substrate pad disposed thereon. The bump is configured to electrically interconnect at least a portion of the semiconductor with at least a portion of the substrate when the bump is contacted with the substrate pad. In addition, when the bump is contacted to the substrate pad, at least a portion of the bump and at least a portion of the substrate pad are deformed so as to create a non-metallurgical bond therebetween.

19 Claims, 14 Drawing Sheets

(56) References Cited

U.S. PATENT DOCUMENTS

| | | | |
|---|---|---|---|
| 6,555,414 B1* | 4/2003 | Vanfleteren et al. | 438/108 |
| 2005/0230826 A1* | 10/2005 | Tanaka et al. | 257/737 |
| 2007/0096311 A1* | 5/2007 | Humpston et al. | 257/734 |
| 2009/0057378 A1* | 3/2009 | Hwang et al. | 228/248.1 |
| 2009/0325348 A1* | 12/2009 | Gerber | 438/120 |

OTHER PUBLICATIONS

Osborn, T., et al., "All-Copper Chip-to-Substrate Interconnects Part I. Fabrication and Characterization", J. Electrochem. Soc. 155, pp. D308-D313 (Feb. 2008).*

He, A., et al., "All-Copper Chip-to-Substrate Interconnects Part II. Modeling and Design", J. Electrochem. Soc. 155, pp. D314-D322 (Feb. 2008).*

* cited by examiner

INTERCONNECT ASSEMBLIES AND METHODS OF MAKING AND USING SAME

CROSS-REFERENCE TO RELATED APPLICATIONS

The present application claims the benefit of International Patent Application Serial Number PCT/US2010/041828, filed 13 Jul. 2010, which claims the benefit of U.S. Provisional Patent Application Ser. No. 61/225,015, filed 13 Jul. 2009, and U.S. Provisional Patent Application Ser. No. 61/307,113, filed 23 Feb. 2010, all of which are hereby incorporated by reference in their entirety as if fully set forth below.

TECHNICAL FIELD

The various embodiments of the present invention relate generally to fine pitch, chip-to-substrate interconnects, wherein a bump interconnect is utilized, and to methods of making and using the same.

BACKGROUND

In a continuous drive to achieve low form-factor packages, chip-to-substrate interconnect devices have evolved from conventional solder-based techniques. As microelectronic systems follow the trend toward higher functionality with ever-decreasing dimensions, the miniaturization of electrical systems has called for a much wider perspective, requiring passive components and active devices to be integrated on a single platform at both micro- and nano-scales. The "system on package" (SOP) techniques achieved earlier goals because they enabled electrical systems to be scaled, promised a paradigm shift in the way systems were perceived, and set a roadmap for ultra-miniaturization with novel interconnect solutions.

For example, one such interconnect solution involves chip-to-substrate interconnect assemblies that utilize "flip-chip" technology. In general, solder bumps were placed on an active surface of a chip, and the chip was subsequently flipped such that the solder bumps could be connected to a substrate pad. However, physical constraints due to the geometry of the interconnection became an obstacle in reducing the bump pitch or density and achieving high reliability. In addition, electro-migration issues and intermetallic formations posed additional concerns. Several interconnect assemblies have been explored to achieve ultra-fine pitch, for example, pad-to-pad gold bonding and bump-to-pad nickel bonding. Pad-to-pad gold bonding cures the aforementioned defects of solder bumps; however, the bonding is relatively expensive to make. Further, low bonding temperature cannot be achieved with bump-to-pad nickel bonding. Therefore, there is a need in the art for a fine pitch, chip-to-substrate interconnect assembly that is compatible with flip-chip technology, less costly than gold interconnects, and has the ability to handle increased input/output (I/O) density.

SUMMARY

Some embodiments of the present invention provide fine pitch, chip-to-substrate interconnect assemblies. Other embodiments provide methods of making fine pitch, chip-to-substrate interconnect assemblies. Finally, some embodiments provide methods of using fine pitch, chip-to-substrate interconnect assemblies.

According to some embodiments of the present invention, an interconnect assembly can include a semiconductor, an electrically conducting die pad disposed on at least a portion of a surface of the semiconductor, and an electrically conducting bump disposed on at least a portion of the die pad. In addition, the interconnect assembly can include a substrate and an electrically conducting substrate pad disposed on at least a portion of a surface of the substrate. The bump can be configured to electrically interconnect at least a portion of the semiconductor with at least a portion of the substrate when the bump is contacted with the substrate pad. Upon contacting the bump to the substrate pad, at least a portion of the bump and at least a portion of the substrate pad can substantially deform to create a non-metallurgical bond therebetween. In some cases, the non-metallurgical bond is a pressurized contact bond.

The interconnect assembly can further include a dielectric layer disposed between the substrate and the substrate pad. In such cases, it is possible for at least a portion of the dielectric layer to at least partially deform upon contacting the bump to the substrate pad.

The interconnect assembly can further comprise an intermediate bonding layer that is disposed between the bump and substrate pad.

The deformation of at least a portion of the bump and at least a portion of the substrate pad can be formed from an applied pressure of at least about 300 megaPascals.

The interconnect assembly can also include a non-reactive adhesive disposed between the bump and the substrate pad, wherein the non-reactive adhesive is configured to enhance the non-metallurgical bond. In some cases the adhesive can be formed from a non-conductive film. In other cases, the adhesive can be formed from an anisotropically conductive material.

In some cases, the die pad, bump, and/or substrate pad can be formed from copper. This allows interconnection between a semiconductor and an organic substrate, an inorganic substrate, or another semiconductor.

When two or more bumps are used, a distance between one bump and an adjacent bump can be less than or equal to about 30 micrometers. In some cases, the distance between every bump and an adjacent bump is less than or equal to about 30 micrometers.

According to some embodiments of the present invention, a method of making an interconnect assembly includes providing a semiconductor that comprises an electrically conducting die pad disposed on at least a portion of a surface of the semiconductor and an electrically conducting bump disposed on at least a portion of the die pad. The method can also include providing a substrate that comprises an electrically conducting substrate pad disposed on at least a portion of a surface of the substrate. Still further, the method can include contacting the electrically conducting bump with the electrically conducting substrate pad. The method can also include deforming at least a portion of the bump and at least a portion of the substrate pad to create a non-metallurgical bond therebetween.

It should be noted that the substrate pad can be disposed on a dielectric layer that serves as the surface of the substrate. In such cases, at least a portion of the dielectric layer can be deformed during the deforming step.

The deforming step can involve applying a pressure of at least about 300 megaPascals.

The method can further include disposing a non-reactive adhesive between the bump and the substrate pad such that non-reactive adhesive is configured to enhance the non-metallurgical bond. When two or more bumps are involved, a distance between one bump and an adjacent bump can be less than or equal to about 30 micrometers. In some cases, the distance between every bump and an adjacent bump is less than or equal to about 30 micrometers.

Another interconnect assembly, according to some embodiments of the present invention, can include a semiconductor, a copper die pad disposed on at least a portion of a surface of the semiconductor, and a copper bump disposed on at least a portion of the copper die pad. The interconnect assembly can also include a substrate and a copper substrate pad disposed on at least a portion of a surface of the substrate. The interconnect assembly can also include a non-reactive adhesive. Within the interconnect assembly, the copper bump can be configured to electrically interconnect at least a portion of the semiconductor with at least a portion of the substrate when the copper bump is contacted with the copper substrate pad. Upon contacting the copper bump to the copper substrate pad, at least a portion of the bump and at least a portion of the substrate pad can be substantially deformed to create a non-metallurgical bond therebetween. The non-metallurgical bond can be enhanced by the non-reactive adhesive.

Other aspects and features of embodiments of the present invention will become apparent to those of ordinary skill in the art, upon reviewing the following description of specific, exemplary embodiments of the present invention in concert with the various figures. While features of the present invention may be discussed relative to certain embodiments and figures, all embodiments of the present invention can include one or more of the features discussed in this application. While one or more embodiments may be discussed as having certain advantageous features, one or more of such features may also be used with the other various embodiments of the invention discussed in this application. In similar fashion, while exemplary embodiments may be discussed below as system or method embodiments it is to be understood that such exemplary embodiments can be implemented in various devices, systems, and methods. Thus discussion of one feature with one embodiment does not limit other embodiments from possessing and including that same feature.

DETAILED DESCRIPTION

Figure 1:
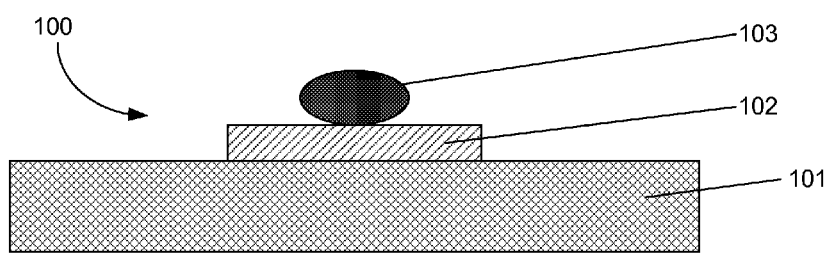
FIG. 1 is a schematic illustration of a semiconductor, a die pad, and a bump in accordance with some embodiments of the present invention.

Referring now to the figures, wherein like reference numerals represent like parts throughout the several views, exemplary embodiments of the present invention will be described in detail. Throughout this description, various components may be identified having specific values or parameters, however, these items are provided as exemplary embodiments. Indeed, the exemplary embodiments do not limit the various aspects and concepts of the present invention as many comparable parameters, sizes, ranges, and/or values may be implemented. The terms "first," "second," "primary," "secondary," "top," "bottom," "distal," "proximal," and the like, do not denote any order, quantity, or importance, but rather are used to distinguish one element from another. Further, the terms "a," "an," and "the" do not denote a limitation of quantity, but rather denote the presence of "at least one" of the referenced item.

The various embodiments of the present invention relate to improved fine pitch, chip-to-substrate interconnects to create interconnects between a semiconductor and a substrate. Specifically, a non-metallurgical bond is created between a semiconductor and a substrate by deforming the bump and the corresponding substrate pad and optionally utilizing a non-reactive adhesive to strengthen the bond. The methods of manufacture are also described herein.

The bumps used to make the interconnects described herein can be formed from a variety of metals or alloys. When chosen from a metal, the bump can be formed from copper, aluminum, silver, nickel, lead, palladium, and platinum, among others. If the bump is formed from an alloy, it can be a tin-silver, tin-gold, tin-silver-gold, or other like alloy. In exemplary embodiments, however, the bumps are formed from copper owing to its excellent electrical conductivity, mechanical stability, and relatively inexpensive cost. Additionally, because most semiconductor foundries are now equipped with advanced copper electroplating systems, the manufacturing of copper bump interconnects can be easily integrated into the processes, thus keeping the cost of manufacturing copper bump interconnects relatively low.

Referring now to FIG. 1, there is shown a semiconductor 101, which, as understood by those skilled in the art to which this disclosure pertains, can also be referred to as a die, an integrated circuit (IC), a wafer, a microcircuit, a microchip, a silicon chip, a semiconductor chip, or a chip. In exemplary embodiments, the semiconductor 101 is made from silicon. In exemplary embodiments, the surface of the silicon semiconductor 101 is oxidized to enhance bonding characteristics. In other exemplary embodiments, glass can be used in place of the silicon semiconductor.

One or more die pads 102 can be disposed on the oxidized or non-oxidized surface of the semiconductor 101. For illustrative convenience, only one die pad 102 is shown in FIG. 1, but it will be understood that the semiconductor 101 is capable of having a plurality of die pads 102 disposed thereon. The die pads 102 can be fabricated from aluminum, copper, titanium, or an alloy or other combination comprising at least one of the foregoing. Many other conductive metals or conductive metal alloys/combinations also can be used to fabricate the die pad 102.

At least one bump 103 can be disposed on each of the die pads 102. As described above, many materials can be used to fabricate the bump 103. The bump 103 also can be coated with a protective finish. It is important, however, that the bump 103 has suitable deformation characteristics to deform at less than or equal to about 300 megaPascals (MPa) of pressure and can withstand temperatures up to about 300 to about 400 degrees Celsius (° C.). The bump 103 can adopt a variety of shapes. In exemplary embodiments, however, the bump 103 is cylindrical in shape, with an oval head. When more than one bump 103 is used, each bump 103 is desirably coplanar with the other bumps 103.

Figure 2:
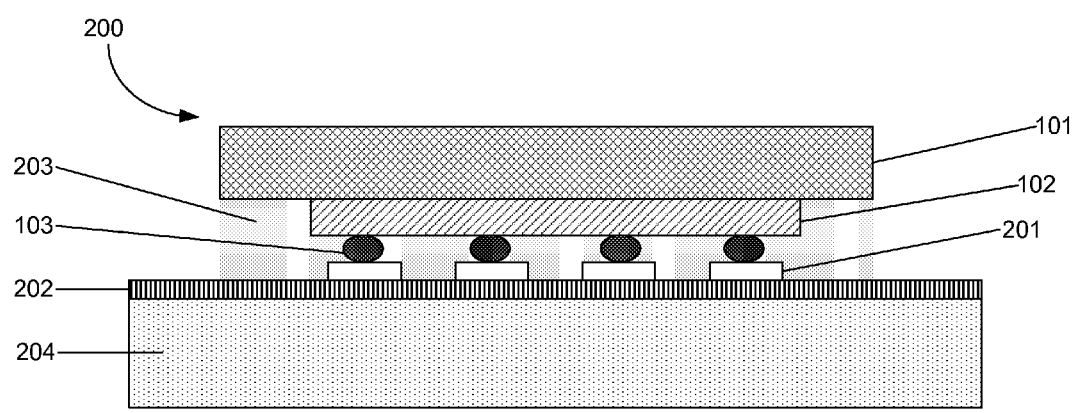
FIG. 2 is a schematic illustration of a chip-to-substrate interconnect assembly in accordance with some embodiments of the present invention.
Figure 3:
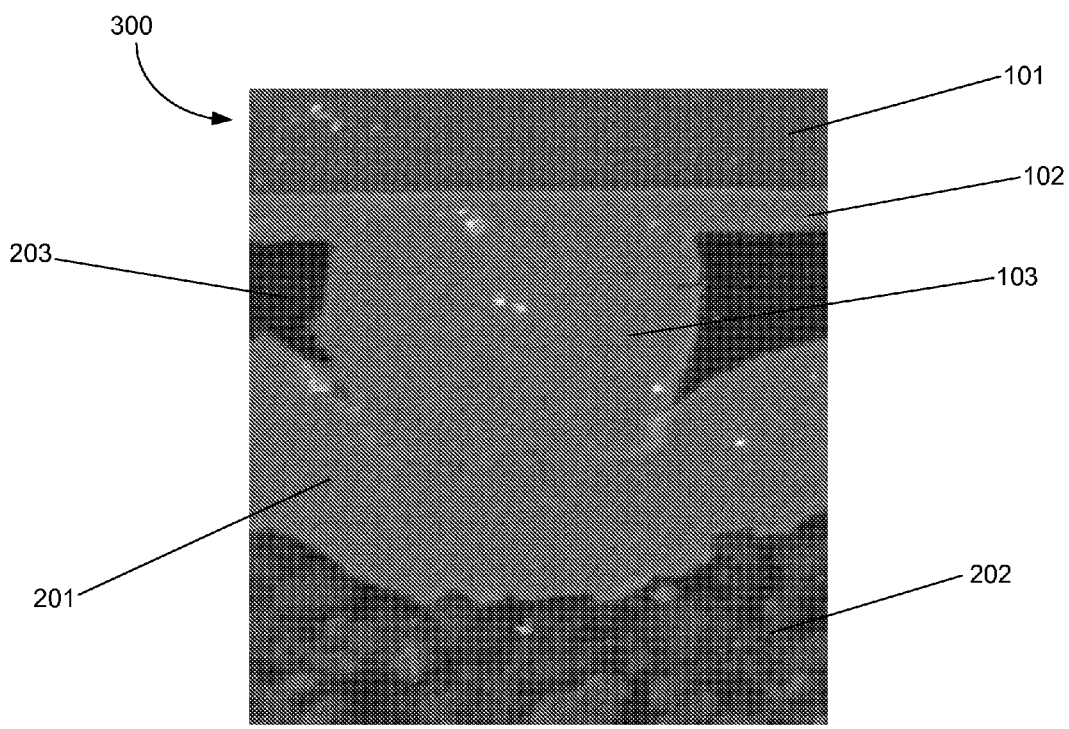
FIG. 3 is a scanning electron microscope (SEM) image of a chip-to-substrate interconnect assembly in accordance with some embodiments of the present invention.

The semiconductor 101, the die pad 102, and the bump 103 generally form the chip assembly 100, which can be "flipped" onto a substrate 204 such that the bump 103 faces the substrate 204. This is illustrated in greater detail in FIG. 2. The "substrate," as understood by those skilled in the art to which this disclosure pertains, can also be referred to as a printed circuit board (PCB), a printed wiring board (PWB), an etched wiring board, a printed circuit assembly, or a printed circuit board assembly. The substrate 204 can be fabricated from an organic or inorganic material. A dielectric layer 202 can be further disposed on the surface of the substrate 204. The dielectric layer 202 serves to prevent short circuits and provides overall rigidity to the chip-to-substrate assembly 200. The dielectric layer 202 can be made of any dielectric material suitable for use in such devices, as would be known to those skilled in the art to which this disclosure pertains. For example, softer dielectric materials (materials with a low Young's Modulus) may allow for more deformation and thus enhance reliability, but even for other dielectric materials which may not deform so readily, the reliability can be obtained by adjusting the pressure such that the pad still deforms without dielectric deformation.

At least one substrate pad or trace 201 can be disposed on the dielectric layer 202. The chip assembly 100 is flipped such that a bump 103 faces the substrate 204 and makes contact with a substrate pad 201. Each substrate pad 201 can have one or more bumps 103 to enhance electrical connectivity. The substrate pads 201 can be formed from a variety of materials; however, it is important that there is sufficient electrical conductivity between the substrate pads 201 and the bumps 103. In exemplary embodiments, the substrate pads 201 are formed from the same material as the bumps 103. The bumps 103 and corresponding substrate pads 201 electrically communicate with each other by contact. A force of pressure is applied to the chip-to-substrate assembly 200, which causes at least the bumps 103 and substrate pads 201 to deform, thereby creating a non-metallurgical contact or connection. Stated another way, the bumps 103 form a pressure contact bond with the substrate pads 201.

If desired, localized metallurgical bonding can be used to enhance the connection between a bump 103 and substrate pad 201. In such cases, the localized metallurgical bonding occurs via an intermediate bonding layer that is disposed between the bump 103 and substrate pad 201 and can be a part of the bump, the pad or the adhesive. That is, when a localized metallurgical bond is implemented, the interaction between the bump 103 and substrate pad 201 is more than a physical pressure contact.

In some embodiments, an adhesive 203 can be used to strengthen the interaction between the bump 103 and substrate pad 201. Before the bump 103 contacts the substrate pad 201, an adhesive 203, having a thickness of about 3 to about 5 micrometers (μm), for example, can be disposed onto the surface of the substrate pad 201. The adhesive 203 can be fabricated from a number of non-conductive films (NCF), for example, but not limited to, polymeric materials. The adhesive 203 can also be fabricated from a number of anisotropically conductive materials. The adhesive 203 material is preferably non-reactive with the other components of the device or assembly. The adhesion properties of the adhesive 203 can be optimized by adding additives, such as adhesion promoters, corrosion inhibitors, and curing agents to reduce the moisture uptake of the adhesive. In preferred embodiments, the adhesive 203 has a storage modulus of about 2 gigaPascals (GPa), a glass transition temperature of about 115° C., and a coefficient of thermal expansion between about 65 and about 70 ppm/° C. The adhesive 203 can be heated to achieve a gel-like structure, which allows the bump 103 to pierce through it and make an electrical connection with the substrate pad 201.

Together, the die pad 102, the bump 103, and the substrate pad 201 make up the interconnect. The height of the interconnect can vary. In exemplary embodiments, however, the height of the interconnect is about 20 μm. The interconnect is adapted to put at least a portion of the semiconductor 101 and at least a portion of the substrate 204 in electrical communication with each other.

A method of manufacturing the chip-to-substrate assembly 200 can generally include fabricating the semiconductor 101, fabricating the substrate 204, and interconnecting the two with a bump 103 such that they are in electrical communication with each other. Semiconductor and substrate fabrications processes are well-known to those skilled in the art, and are therefore not described in detail herein. In some embodiments, the semiconductor is fabricated using silicon chips assembled on glass substrates. The glass substrate enables visual inspection of the assembled chip from the backside, such that high alignment accuracy can be achieved for chips assembled at 30 μm pitch. In other embodiments, the surface of the semiconductor 101 is oxidized. One or more die pads 102 can be subsequently disposed on the oxidized or non-oxidized surface of the semiconductor 101, and one or more bumps 103 can then be disposed on the surface of the one or more die pads 102. In various embodiments, the bumps 103 are made from copper and are substantially coplanar. Coplanarity of the bumps 103 can be achieved using a copper plating process. The die pads 102 and the bumps 103 can be manufactured in such a way that their total height is approximately 13.1 μm with a standard deviation of 0.45 μm.

Before, after, or contemporaneous with assembly of the semiconductor 101, die pads 102, and bumps 103, the substrate 204 can be prepared. In some embodiments, a dielectric layer 202 can serve as the upper surface of the substrate 204. In such cases, substrate pads 201 can be disposed on the surface of the dielectric layer 202. When a dielectric layer 202 is not used as the upper surface of the substrate 204, the substrate pads 201 can be disposed directly on the upper surface of the substrate 204 itself. A thin layer of heated adhesive 203 can be disposed on the substrate pads 201. The chip assembly 100, comprising the semiconductor 101, die pads 102, and bumps 103, can be subsequently "flipped" onto the substrate 204 such that the bump 103 pierces through the adhesive 203 and makes contact with a corresponding substrate pad 201. A pressure of approximately 300 MPa can be applied to the resultant chip-to-substrate assembly 200, causing at least the bumps 103 and the substrate pads 201 to substantially deform. This deformation creates a non-metallurgical, pressure contact bond between the semiconductor 103 and the substrate 204. Other components of the chip-to-substrate assembly 200 also can be deformed under the applied pressure. For example, in some cases, the dielectric layer 202 can at least partially deform from this pressure. The pressure contact bond causes the adhesive 203 to disperse and fill the void space between the semiconductor 101 and the substrate 204, therefore enhancing the bond therebetween. If desired, the adhesive 203 can be subsequently cured.

Figure 4:
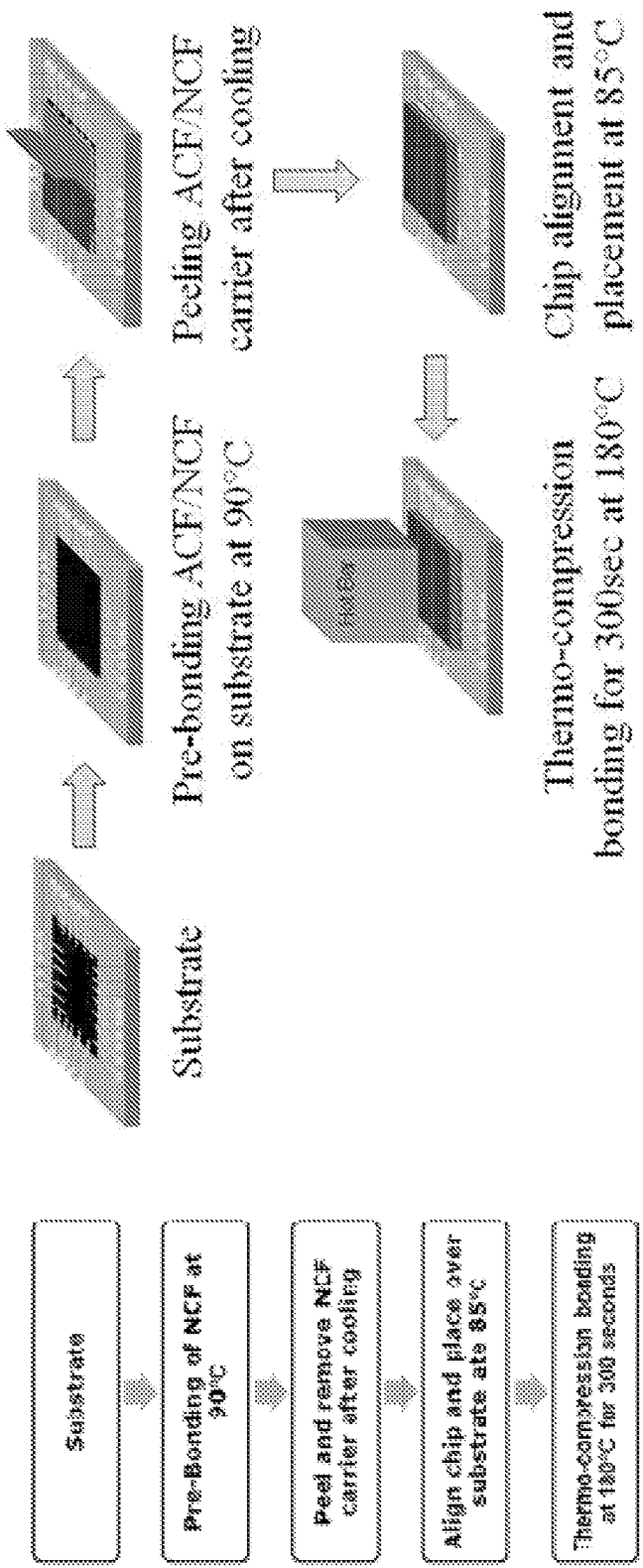
FIG. 4 is a schematic illustration of a method of manufacturing the chip-to-substrate assembly in accordance with some embodiments of the present invention.

An exemplary schematic process flow for assembly of an interconnect is illustrated in FIG. 4. In these embodiments, the chip-to-substrate assembly 200 is manufactured using a FINETECH Fineplacer© Lambda assembly tool to assist with alignment accuracy (e.g., to an accuracy of about ±1 μm). Tilt of the die while placement on the substrate can be addressed by using a tool head with a gimble, which allows for both preleveling and automatic leveling during assembly.

The assembly process for chips bonded on the surface of an organic substrate and/or within a cavity of an organic substrate would be identical. The organic substrate can be pre-bonded with an NCF at about 90° C. for about 15 seconds, followed by cooling to room temperature and removing an NCF liner. The size of the NCF bonded in the cavity of the organic substrate can be controlled to avoid excessive flow of NCF within the cavity, which can lead to an overflow over the cavity wall. The semiconductor or die can then be aligned to the substrate and disposed on it after pre-heating it to about 85° C. to reduce the viscosity of the NCF. Finally the die and the substrate can be subjected to a predetermined load/pressure at about 180° C. for about 30 seconds. The applied load for a 3 millimeter (mm)×3 mm die size is about 21 Newtons (N), which translates to a contact pressure of about 300 MPa on the surface of the bumps. The applied load for a 7 mm×7 mm die size is calculated based on the effective cross-section of all the bumps so that the contact pressure is still approximately 300 MPa.

EXAMPLES

In the following examples, various interconnect assemblies were fabricated. The various interconnect designs were fabricated to systematically study the reliability of the interconnections between different die sizes and thicknesses. Performance of the interconnections were also evaluated by embedding the dies in certain organic substrates. That is, flip-chip dies having different thicknesses were interconnected with organic substrates, which either had no cavity or a cavity on the surface.

Figure 5:
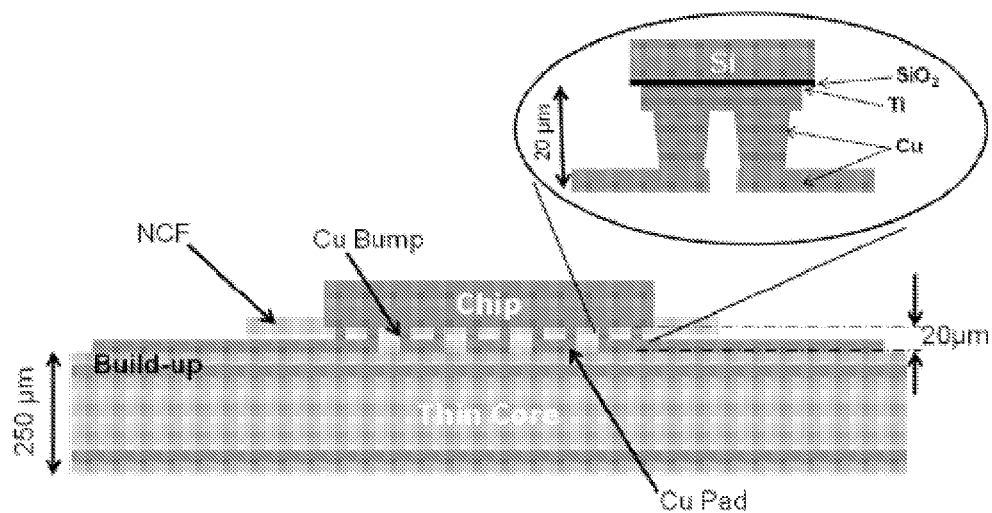
FIG. 5 is a schematic illustration of a cross-section of an interconnect assembly in accordance with some embodiments of the present invention.

For each of these examples, the general structure of the interconnect assembly is shown in FIG. 5. In general, the dies were fabricated using a standard semi-additive process (SAP). A die pad layer, having a thickness of about 1 to about 2 μm, was made by electroplating copper over a titanium layer of about 400 Angstrom (Å) thickness. Copper bumps about 12 μm in height were then patterned and electroplated on the die pads. The copper bumps were given a surface finish with nickel and gold using electroless nickel and immersion gold (ENIG) techniques. Copper bumps were fabricated on about 550 μm thick wafers out of which some wafers were thinned down to about 55 μm thickness. In some cases, as will be described below, the about 55 μm thick dies were used to establish the handling and assembly process of such dies prior to embedding them inside a cavity.

The substrates were fabricated using an organic, ultra-high wiring density build-up substrate developed for achieving chip-to-substrate interconnections having a pitch of about 30 μm. This organic substrate comprised a low-loss thin core laminate and low dielectric constant/low-loss build-up dielectric. The pads and traces on the substrate were also given a surface finish using ENIG techniques.

Example 1

Design and Fabrication of a Chip-to-Substrate Interconnect Assembly

Figure 6:
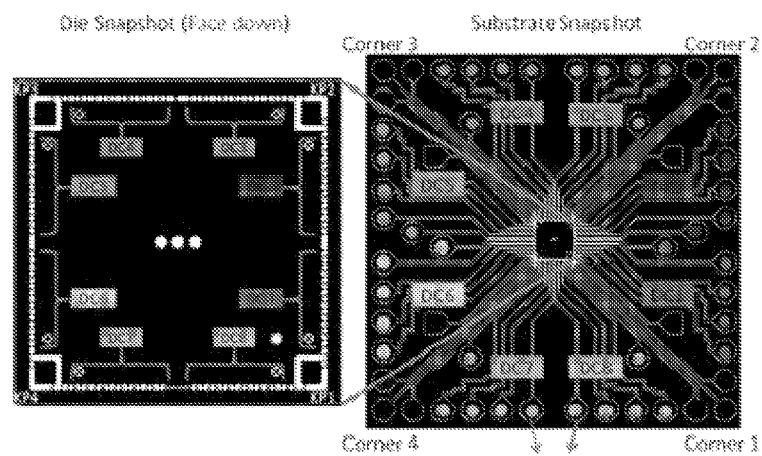
FIG. 6 is a schematic illustration of a die (left) and substrate (right) design depicting Kelvin probe and daisy chain structures in accordance with some embodiments of the present invention.

In this example, the device, which is referred to as "TV1" for convenience, was designed to extract single bump resistance and daisy chain resistance data. This device was designed for 3 mm×3 mm dies and the interconnect layout was peripheral with 360 bumps around the die. The design was comprised of 4 Kelvin test structures and 8 daisy chains with 32 bumps each. FIG. 6 shows the position of Kelvin test structures (KP) and daisy chains (DC) in the die and substrate design. The die design also included fiducials for both alignment and orientation.

The substrate was designed for probing every eight bumps in the daisy chain. The size of the substrate was about 25 mm×about 25 mm and was fabricated without a cavity on the surface. Sixteen probe pads, four on each corner were dedicated to four probe measurement and forty probe pads, ten on each side were designed for daisy chain measurements as shown in FIG. 6.

Example 2

Design and Fabrication of a Chip-to-Substrate Interconnect Assembly

In this example, the device, which is referred to as "TV2" for convenience, was designed to test the reliability of the interconnect after completely embedding a thin die in the organic substrate. The design for TV2 was done for about 3 mm×about 3 mm dies having 216 peripheral bumps. As the physical tolerances for this test vehicle were more stringent as compared to TV1, the pitch was relaxed to about 50 µm. The design included 4 Kelvin test structures and 3 full daisy chains and 2 half daisy chains as shown in the design snapshot of the substrate in FIG. 7.

Figure 7:
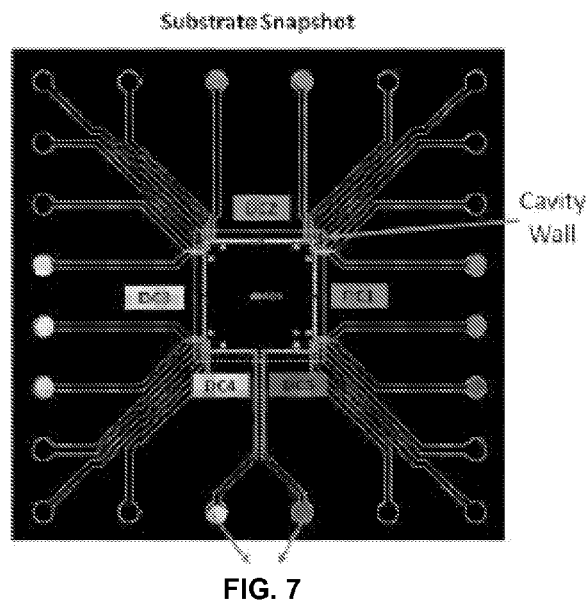
FIG. 7 is a schematic illustration of a substrate design depicting daisy chain structures in accordance with some embodiments of the present invention.

The substrate was designed for probing individual daisy chains. The size of the substrate was about 12 mm×about 12 mm and was fabricated with a cavity on the surface of the substrate. The clearance between the cavity wall and die edge was about 400 µm. The cavity size was determined by considering chip size as well as various tolerances, such as chip size tolerances, cavity process tolerances and chip placement tolerances during assembly. FIG. 7 shows the design of the substrate with the edges of the cavity wall near the pads.

Figure 8:
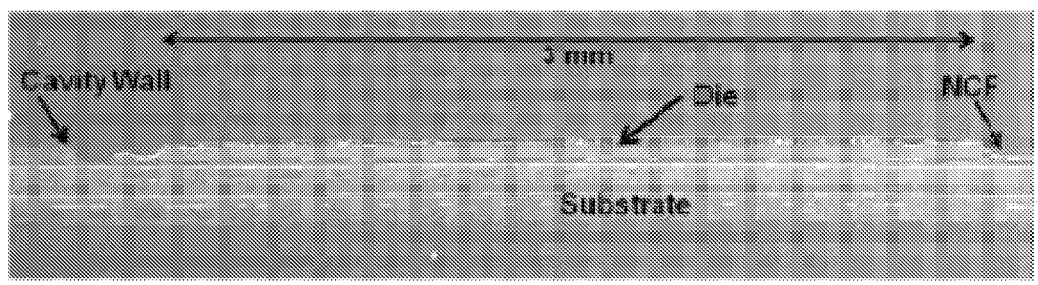
FIG. 8 is an SEM image of a die and substrate in accordance with some embodiments of the present invention.

For creating a cavity for embedding the die, three different options were explored, namely: photolithography, plasma etching, and laser drilling. For the plasma etching sample, cavities were created on the surface of the substrate by laminating an about 60 µm thick layer of build-up dielectric on the metallization and drilling out a cavity, slightly larger than the die size, using a $CO_2$ laser. The thickness of this extra build-up layer was chosen in a way to ensure that the top surface of the die was substantially level with the surface of the build-up. The bottom surface of the cavity was cleaned, prior to assembly, using plasma to remove any debris accumulated from the laser drilling process and ensure a clean copper pad surface. A $CF_4/O_2/N_2$ plasma was used at about 100° C. for about 5 minutes for complete cleaning. Openings were provided on the about 60 µm thick build-up material to access the probe pads below. The die was assembled inside the cavity such that it was completely contained inside it as shown in the scanning electron microscope (SEM) image of the cross-section of the sample in FIG. 8.

Example 3

Design and Fabrication of a Chip-to-Substrate Interconnect Assembly

Figure 9:
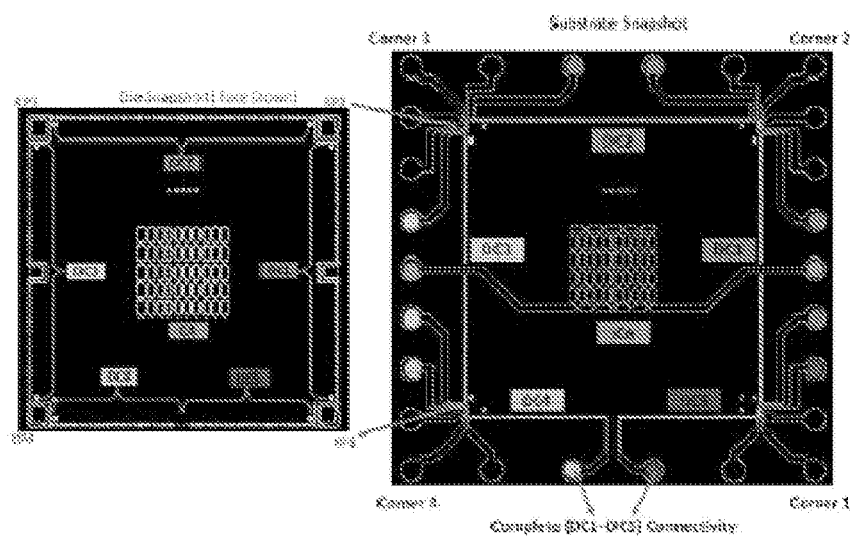
FIG. 9 is a schematic illustration of a die (left) and substrate (right) design depicting daisy chain and center array structures in accordance with some embodiments of the present invention.

In this example, the device, which is referred to as "TV3" for convenience, was designed for evaluating the reliability of the copper interconnects on a larger die. A die size of about 7 mm×about 7 mm was used. The thickness of the die was about 550 µm. The die design included 537 bumps at about 50 µm pitch arranged around the periphery of the die. A square grid of about 10×about 10 bumps at 200 µm pitch (in both directions) was also incorporated at the center of the die. The design was divided into 3 full daisy chains and 2 half daisy chains along the edge of the die. The substrate was designed to probe individual daisy chains as well as the array of bumps in the center. The size of the substrate was about 12 mm×about 12 mm. The design enabled probing of peripheral daisy chains and the entire array of center bumps from 2 extreme ends as shown in the substrate snapshot in FIG. 9. No cavity was created on the surface of the substrate.

Figure 10:
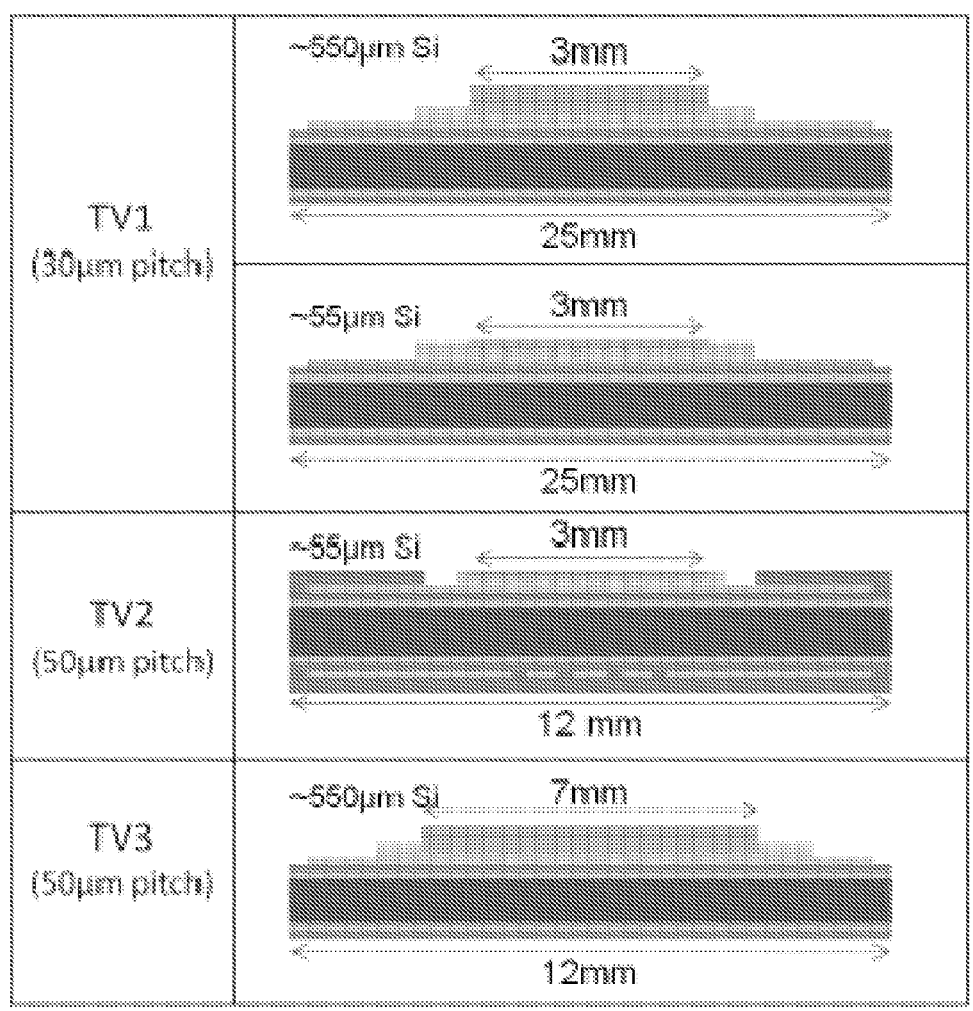
FIG. 10 is a schematic illustration of a die and a substrate at different pitches in accordance with some embodiments of the present invention.

For illustrative convenience, schematic illustrations of the TV1, TV2, and TV3 samples, with relevant dimensions, are shown in FIG. 10.

Example 4

Coplanarity Analysis of Copper Bumps

Figure 11:
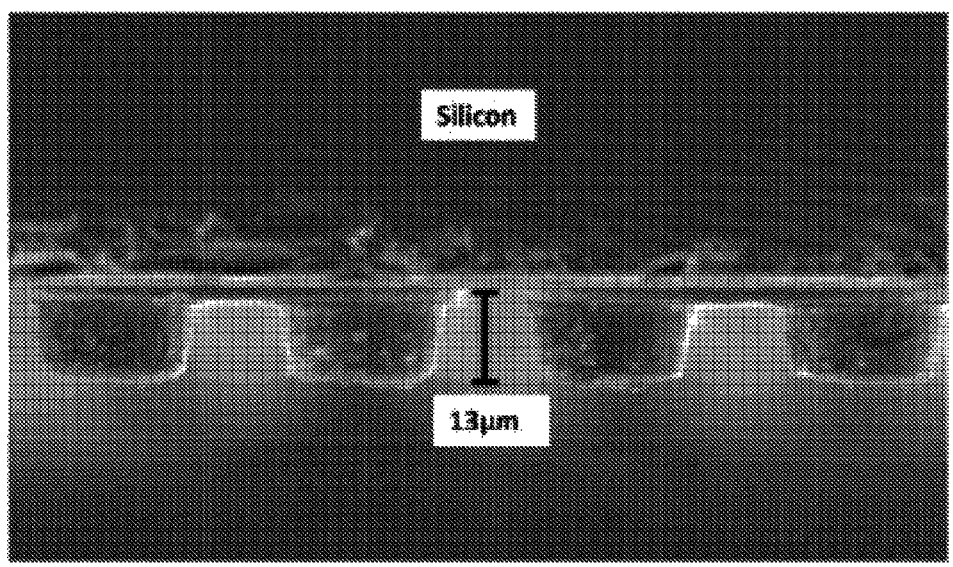
FIG. 11 is a SEM image of four substantially coplanar copper bumps in accordance with some embodiments of the present invention.
Figure 12:
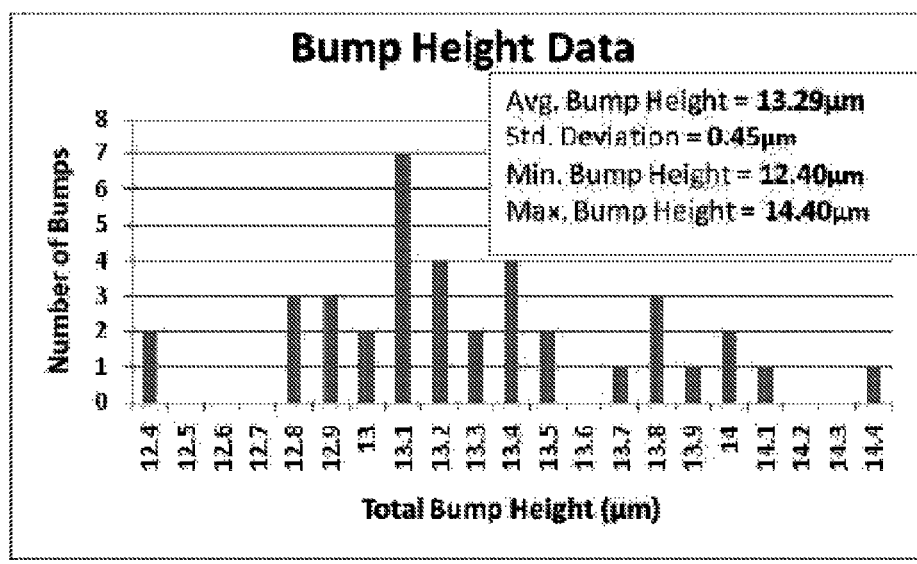
FIG. 12 is a graph that depicts the height of 38 randomly-measured bumps on a given die in accordance with some embodiments of the present invention.

In this example, die bump coplanarity was evaluated using three randomly selected dies from the same wafer and 38 readings were taken at random positions on all four edges of the die. A representative SEM image of coplanar copper bumps on a die is shown in FIG. 11. The results of the analysis are shown in the graph of FIG. 12. The total height (including the pads on the die side) of most of the copper bumps in the study were closely maintained at 13.1 µm with a standard deviation of 0.45 µm. Thus, substantial coplanarity of the copper bumps was achieved.

Example 5

Reliability of Interconnect Assemblies

In this example, the reliability of the samples produced in Examples 1-3 were tested. Specifically, samples of TV1, TV2, TV3 were analyzed using the Thermal Cycling Test (TCT) described in JEDEC standard JESD22-A104C (condition B). Assemblies were subjected to a cyclic thermal loading in air from about −55° C. to about 125° C. with a dwell time of about 15 minutes at each extreme temperature. In order to maintain consistency with the standard reliability testing procedure in the industry, all the samples were subjected to a preconditioning (precon) as per joint IPC/JEDEC Standard J-STD-020A before subjecting the samples to any reliability tests. This involved baking the assemblies at about 125° C. for about 24 hours prior to subjecting them to moisture sensitivity level-3 (MSL-3) at about 60° C. and about 60% relative humidity (RH) for about 40 hours followed by 3 times reflow with a peak reflow temperature of about 260° C.

The assemblies were closely monitored using c-mode scanning acoustic microscopy (C-SAM) before and after the preconditioning process for comparison. Individual daisy chain resistance measurements were taken periodically during the thermal cycling tests.

The reliability of TV1 samples will now be discussed. There were two configurations for TV1 as shown in FIG. 10. Specifically, these samples were assembled using both about 550 µm and about 55 µm thick dies on similar organic substrates for testing their performance under TCT. Daisy chain resistance values were recorded after every about 100 cycles. The results of both configurations are discussed in detail below.

Figure 13:
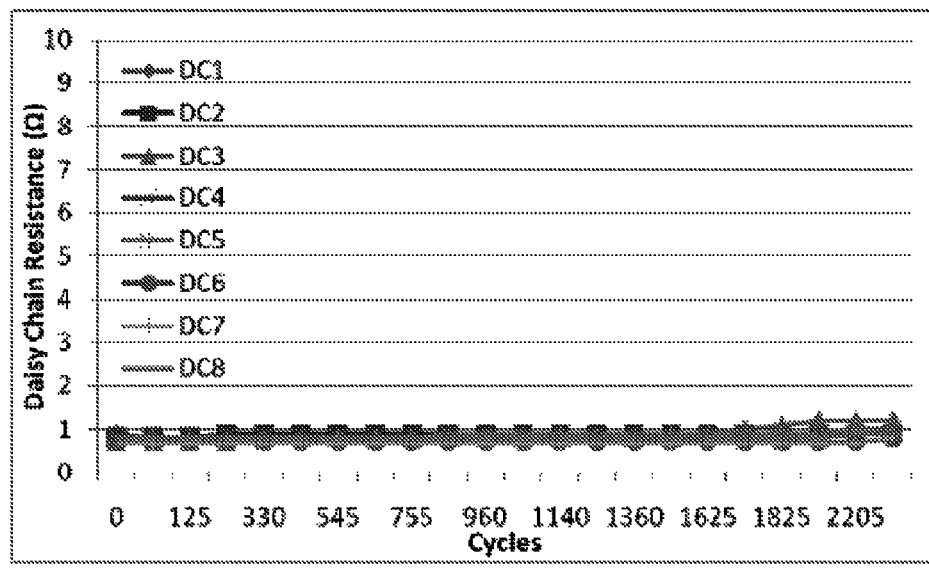
FIG. 13 graphically depicts individual daisy chain resistance values during a thermal cycling test of interconnect assemblies undergoing over 2200 thermal cycles in accordance with some embodiments of the present invention.

First, reference will be made to the TV1 samples having the about 550 µm thick die. All of these samples showed negligible change in daisy chain resistance values through about 1500 cycles. Beyond this, some samples started exhibiting an increase in daisy chain resistance values at different points during the test. All the samples were thermally cycled to failure to investigate the mode of failure. The failure analysis was performed using SEM for imaging the cross-section of the failed daisy chain. For example, FIG. 13 graphically shows that the daisy chain resistance values changed negligibly until about 1500 cycles, with a marginal increase until about 2300 cycles.

Figure 14:
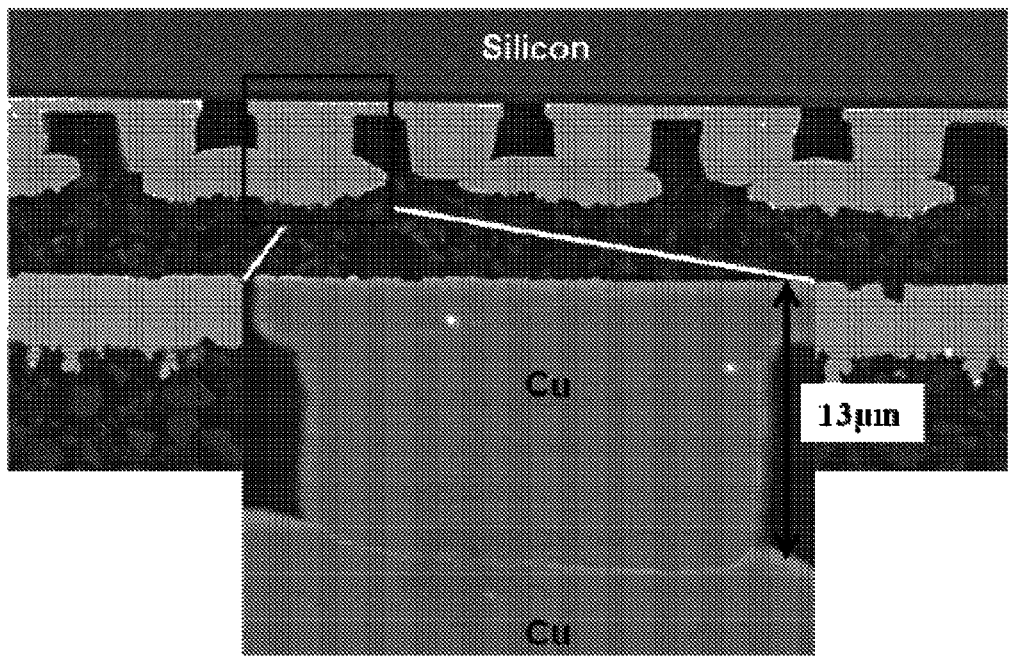
FIG. 14 provides a SEM image of a cross-section of an interconnected daisy chain after over 2000 thermal cycles along with an inset of an interconnection between a copper bump and a copper substrate pad in accordance with some embodiments of the present invention.

FIG. 14 includes a representative SEM image of a cross-section of a daisy chain illustrating a working copper-to-copper interconnection after over 2000 cycles. The interface of a representative copper bump/copper pad interconnection is shown in the inset of FIG. 14.

Figure 15:
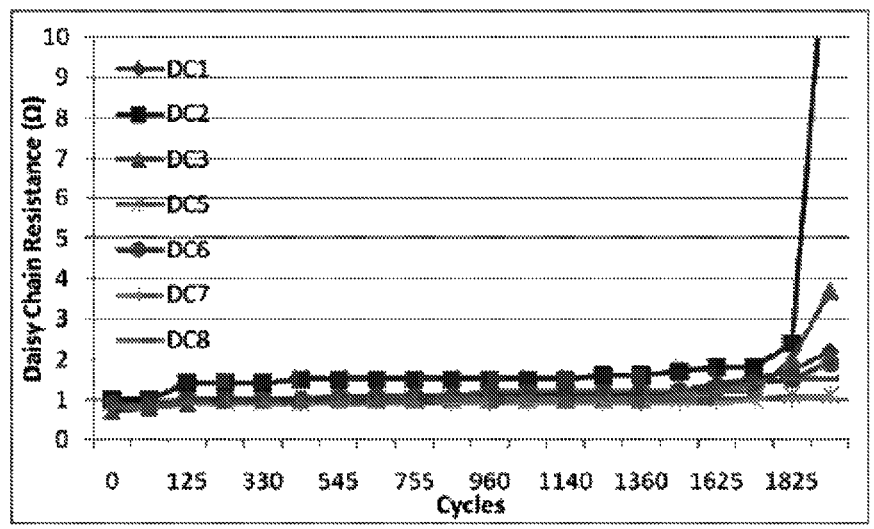
FIG. 15 graphically depicts individual daisy chain resistance values during a thermal cycling test of interconnect assemblies undergoing over 1825 thermal cycles in accordance with some embodiments of the present invention.
Figure 16:
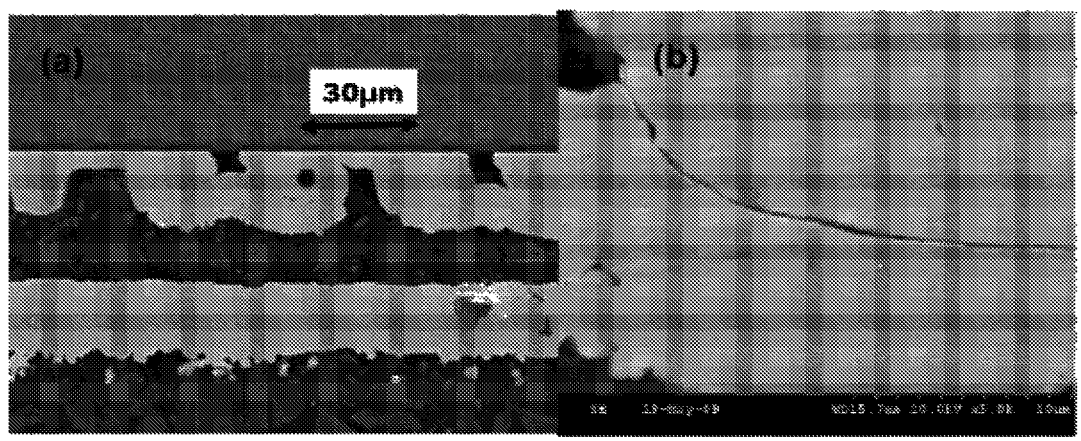
FIG. 16(a) provides a SEM image of a cross-section of a failed portion of a daisy chain after about 1995 thermal cycles in accordance with some embodiments of the present invention.
FIG. 16(b) provides a SEM image of the interface of a copper bump and a copper substrate pad for the interconnect noted by the circle in FIG. 16(a) in accordance with some embodiments of the present invention.

It should be noted that some samples exhibited a significant increase in the daisy chain resistance, indicating an open connection(s) after about 1800 cycles. This is graphically depicted in FIG. 15. These samples were investigated for mode of failure using an SEM. A representative SEM image of a failed daisy chain is shown in FIG. 16(a). The failure of the daisy chain was attributed to the separation of a copper bump from a copper pad, as shown in FIG. 16(b).

Figure 17:
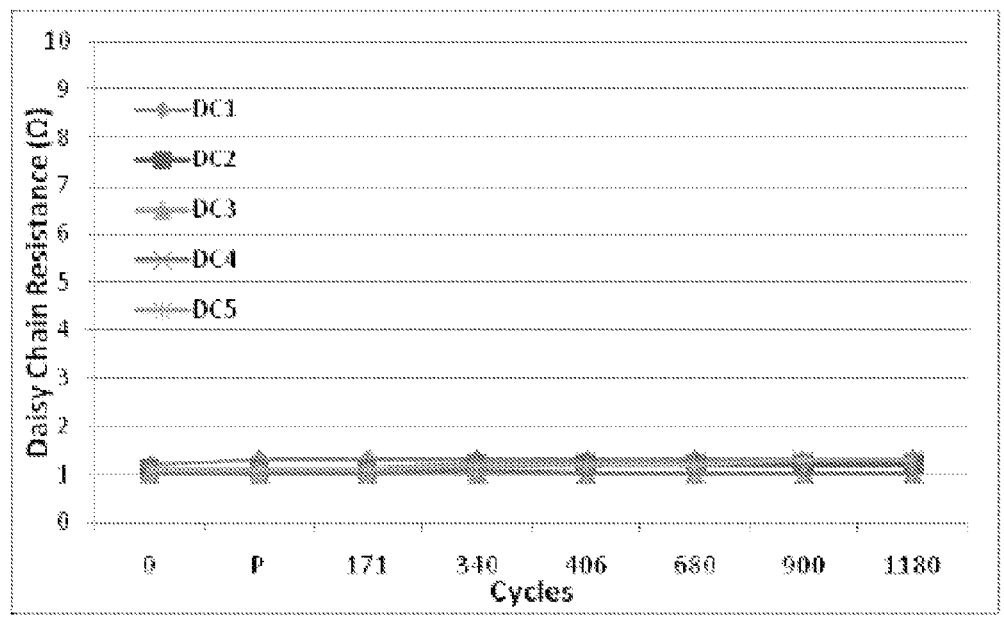
FIG. 17 graphically depicts individual daisy chain resistance values during a thermal cycling test of interconnect assemblies undergoing about 1180 thermal cycles in accordance with some embodiments of the present invention.

Reference will now be made to the TV1 sample having the about 55 μm thick die. The assemblies with thinned dies also were subjected to more than 1000 cycles of TCT. The results of the TCT are shown graphically in FIG. 17. It should be noted that these results do not include data for the daisy chains that did not electrically connect during assembly due to imperfections in the die or the substrate at the start of TCT. The assembly process for thinned dies ensured that a load of about 300 MPa was applied to the copper bumps without damaging the die itself. The reliability results established a working assembly process for the about 55 μm thick dies.

Figure 18:
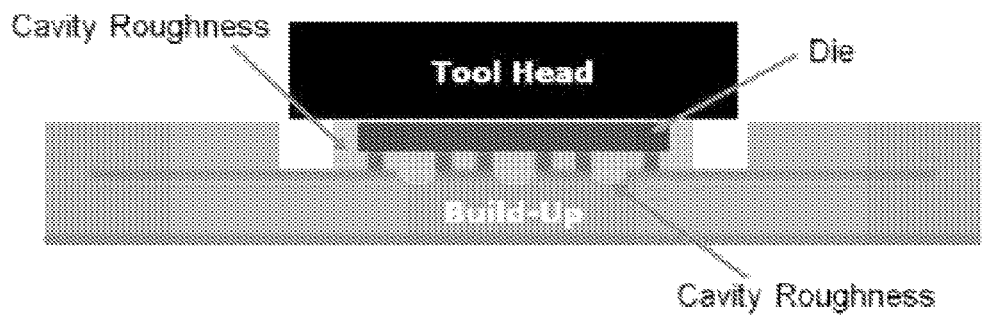
FIG. 18 is a schematic illustration of an interconnect assembly fabrication step wherein the die is disposed in a cavity within the substrate, showing a tool head and non-conductive filler concentration adjusted for surface roughness of the substrate cavity in accordance with some embodiments of the present invention.

The reliability of the TV2 samples will now be discussed. The assembly process was challenging for these samples, because the die was completely embedded in a cavity on the surface of the substrate. One key for a highly reliable assembly was to ensure that the applied load on the copper bumps was equivalent to that used earlier for dies assembled on the surface of the substrate. Another issue was to ensure a sufficiently thick NCF to completely fill the gap between the die and substrate. The assembly process was customized by using a proper tool head for placing the die and using a thicker NCF, thus accounting for the roughness created at the base of the cavity due to laser drilling as shown schematically in FIG. 18.

Figure 19:
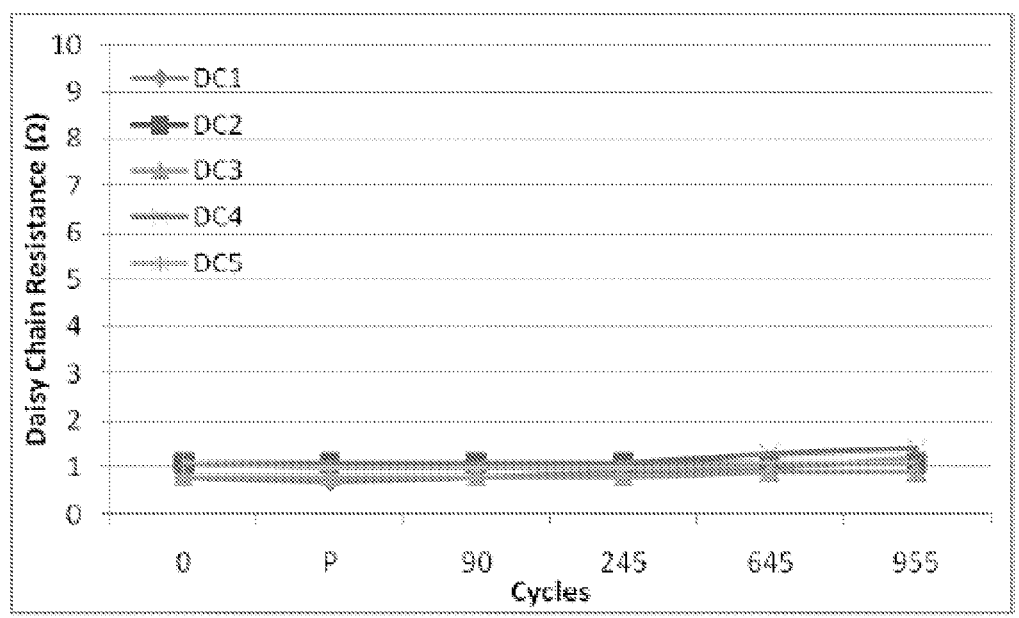
FIG. 19 graphically depicts individual daisy chain resistance values during a thermal cycling test of interconnect assemblies undergoing about 955 thermal cycles in accordance with some embodiments of the present invention.

After the process was developed, the samples exhibited stable daisy chain resistance under thermal cycling for about 1000 cycles as shown graphically in FIG. 19. The C-SAM images confirmed a uniform flow of NCF between the die and substrate and no air gaps were observed after the process improvement.

Figure 20:
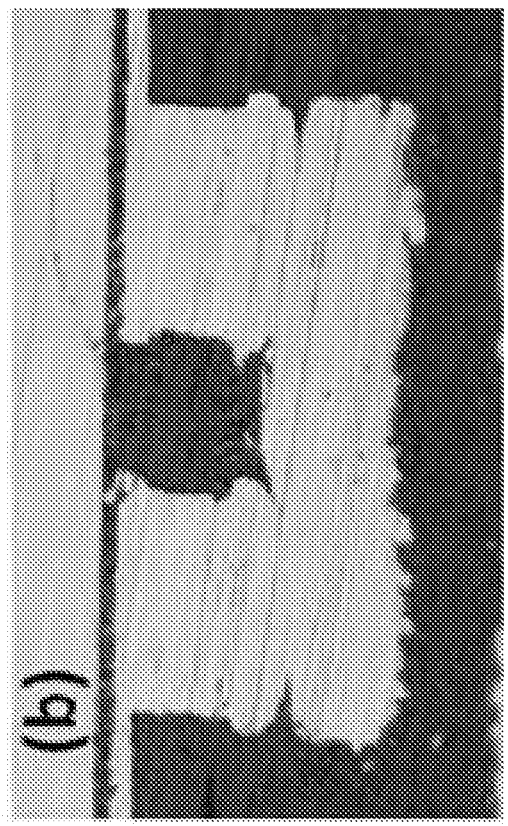
FIG. 20(a) provides a SEM image of a cross-section of a copper bump on a copper pad after an applied load of about 7 kilograms (about 220 MPa) in accordance with some embodiments of the present invention.
FIG. 20(b) provides a SEM image of a cross-section of a copper bump on a copper pad after an applied load of about 9.5 kilograms (about 300 MPa) in accordance with some embodiments of the present invention.
Figure 20:
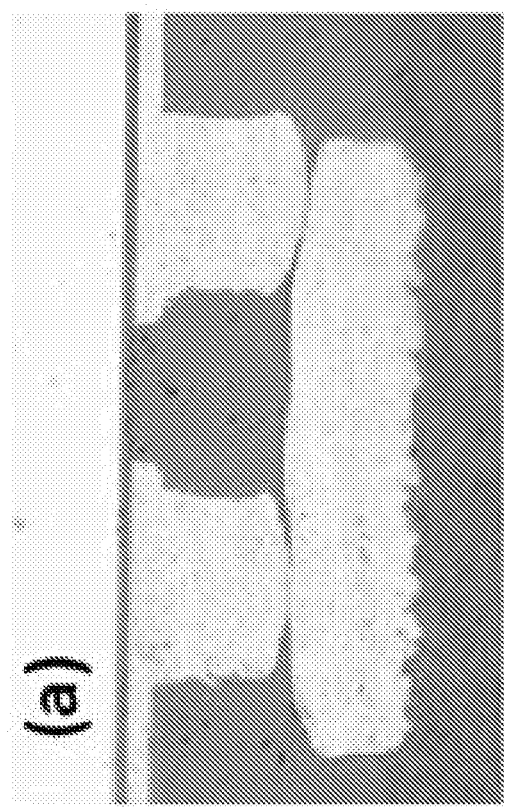

The reliability of the TV3 samples will now be discussed. As mentioned earlier, these samples had greater copper bump to pad contact areas relative to the smaller (i.e., about 3 mm×about 3 mm) dies. As a result, a higher applied load was required to get sufficient deformation of the bump and pad. The appropriate load was calculated considering the total contact surface of the bumps and pads. Greater deformations were seen after increasing the load as shown in the SEM images of FIG. 20. Specifically, the partially interconnected bump and pad in FIG. 20(a) was subjected to a load of about 220 MPa, while the interconnected bump and pad in FIG. 20(b) was subjected to a load of about 300 MPa.

Figure 21:
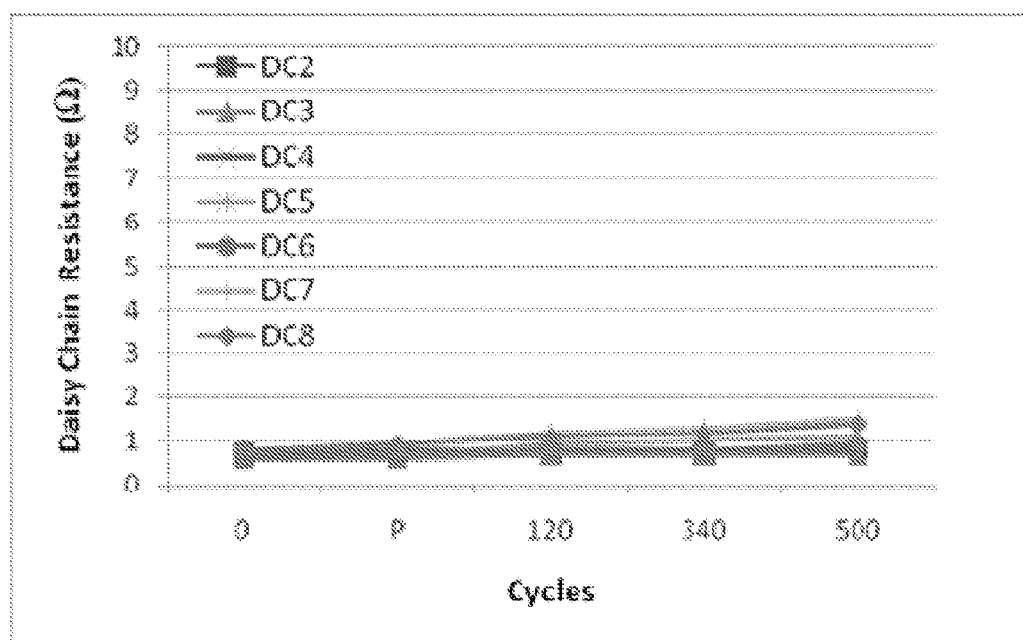
FIG. 21 graphically depicts individual daisy chain resistance values during a thermal cycling test of interconnect assemblies undergoing about 500 thermal cycles in accordance with some embodiments of the present invention.

The assemblies with the higher applied loads showed significant improvement in the reliability. As shown graphically in FIG. 21, the daisy chains showed a stable contact resistance through about 500 cycles.

These examples demonstrated the fabrication and effectiveness of the interconnect assemblies of the present invention. This technology enables ultra-fine pitch and low profiles, which in turn enable higher I/O density, low bonding temperatures, reworkability, testability, and ease of integration with existing manufacturing facilities. To summarize, copper bumps on silicon dies were bonded to copper pads on organic substrates using NCF at about 160° C. The dies were assembled both on the surface and within cavities on an organic substrate. The samples were designed to have a pitch of about 30 to about 50 μm to extract single bump resistance, insulation resistance of NCF and daisy chain resistance. TCT results reinforced the excellent reliability of these interconnections. Both thick die and thin die assemblies exhibited excellent results in thermal cycling and maintained stable contact resistance during the test. The assemblies with larger die sizes of about 7 mm×about 7 mm went through more than 500 cycles of thermal cycling. These initial results for large dies indicated that these interconnections can have applicability to larger dies having high I/O counts. Deformation of copper bumps and pads under the applied load resulted in excellent reliability.

The embodiments of the present invention are not limited to the particular formulations, process steps, and materials disclosed herein as such formulations, process steps, and materials can vary somewhat. Moreover, the terminology employed herein is used for the purpose of describing exemplary embodiments only and the terminology is not intended to be limiting since the scope of the various embodiments of the present invention will be limited only by the appended claims and equivalents thereof. For example, dimensional, temperature, and pressure parameters can vary depending on the particular materials used.

Therefore, while embodiments of this disclosure have been described in detail with particular reference to exemplary embodiments, those skilled in the art will understand that variations and modifications can be effected within the scope of the disclosure as defined in the appended claims. Accordingly, the scope of the various embodiments of the present invention should not be limited to the above discussed embodiments, and should only be defined by the following claims and all equivalents.

We claim:
1. An interconnect assembly, comprising:
a semiconductor;
a die pad disposed on at least a portion of a surface of the semiconductor, wherein the die pad is formed from an electrically conducting material;
a bump disposed on at least a portion of the die pad, wherein the bump is formed from an electrically conducting material;
a substrate; and
a substrate pad disposed on at least a portion of a surface of the substrate, wherein the substrate pad is formed from an electrically conducting material;
wherein the bump is configured to electrically interconnect at least a portion of the semiconductor with at least a portion of the substrate when the bump is contacted with the substrate pad;
wherein upon contacting the bump to the substrate pad, at least a portion of the bump and at least a portion of the substrate pad are substantially deformed to create a non-metallurgical bond therebetween; and
wherein the bump is formed from copper.
2. The interconnect assembly of claim 1, wherein the non-metallurgical bond is a pressurized contact bond.
3. The interconnect assembly of claim 1, further comprising a dielectric layer disposed between the substrate and the substrate pad.

4. The interconnect assembly of claim 3, wherein at least a portion of the dielectric layer is at least partially deformed upon contacting the bump to the substrate pad.

5. The interconnect assembly of claim 1, further comprising an intermediate bonding layer that is disposed between the bump and substrate pad.

6. The interconnect assembly of claim 1, wherein the substantial deformation of the at least the portion of the bump and the at least the portion of the substrate pad is formed from an applied pressure of at least about 300 megaPascals.

7. The interconnect assembly of claim 1, further comprising a non-reactive adhesive disposed between the bump and the substrate pad, wherein the non-reactive adhesive is configured to enhance the non-metallurgical bond.

8. The interconnect assembly of claim 7, wherein the non-reactive adhesive is formed from a non-conductive film.

9. The interconnect assembly of claim 7, wherein the non-reactive adhesive is formed from an anisotropically conductive material.

10. The interconnect assembly of claim 1, wherein the substrate pad is formed from copper.

11. The interconnect assembly of claim 1, wherein the substrate is formed from an organic material.

12. The interconnect assembly of claim 1, wherein a distance between the bump and an adjacent bump is less than or equal to about 30 micrometers.

13. A method of making an interconnect assembly, the method comprising:
providing a semiconductor that comprises an electrically conducting die pad disposed on at least a portion of a surface of the semiconductor and an electrically conducting bump disposed on at least a portion of the die pad;
providing a substrate that comprises an electrically conducting substrate pad disposed on at least a portion of a surface of the substrate; and
contacting the electrically conducting bump with the electrically conducting substrate pad; and
deforming at least a portion of the bump and at least a portion of the substrate pad to create a non-metallurgical bond therebetween; and
wherein the bump is formed from copper.

14. The method of making an interconnect assembly of claim 13, wherein the substrate pad is disposed on a dielectric layer forming the surface of the substrate.

15. The method of making an interconnect assembly of claim 14, wherein at least a portion of the dielectric layer is deformed during the deforming.

16. The method of making an interconnect assembly of claim 13, wherein the deforming comprises applying a pressure of at least about 300 megaPascals.

17. The method of making an interconnect assembly of claim 13, further comprising disposing a non-reactive adhesive between the bump and the substrate pad, wherein the non-reactive adhesive is configured to enhance the non-metallurgical bond.

18. The method of making an interconnect assembly of claim 13, wherein a distance between the bump and an adjacent bump is less than or equal to about 30 micrometers.

19. An interconnect assembly, comprising:
a semiconductor;
a copper die pad disposed on at least a portion of a surface of the semiconductor;
a copper bump disposed on at least a portion of the copper die pad;
a substrate;
a copper substrate pad disposed on at least a portion of a surface of the substrate; and
a non-reactive adhesive;
wherein the copper bump is configured to electrically interconnect at least a portion of the semiconductor with at least a portion of the substrate when the copper bump is contacted with the copper substrate pad;
wherein upon contacting the copper bump to the copper substrate pad, at least a portion of the bump and at least a portion of the substrate pad are substantially deformed to create a non-metallurgical bond therebetween; and
wherein the non-metallurgical bond is enhanced by the non-reactive adhesive.

* * * * *